(12) United States Patent
Cao et al.

(10) Patent No.: US 12,707,718 B2

(45) Date of Patent: Aug. 11, 2026

(54) ARRAY SUBSTRATE, METHOD OF MANUFACTURING THEREOF, AND DISPLAY PANEL

(71) Applicant: WUHAN CHINA STAR OPTOELECTRONICS SEMICONDUCTOR DISPLAY TECHNOLOGY CO., LTD., Wuhan (CN)

(72) Inventors: Zuqiang Cao, Wuhan (CN); Chao Dai, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 778 days.

(21) Appl. No.: 17/263,897

(22) PCT Filed: Aug. 26, 2020

(86) PCT No.: PCT/CN2020/111188

§ 371 (c)(1), (2) Date: Apr. 10, 2023

(87) PCT Pub. No.: WO2022/027741

PCT Pub. Date: Feb. 10, 2022

(65) Prior Publication Data

US 2023/0238386 A1 Jul. 27, 2023

(30) Foreign Application Priority Data

Aug. 6, 2020 (CN) ......................... 202010781420.3

(51) Int. Cl.

*H10D 86/60* (2025.01)
*G02F 1/1362* (2006.01)

(Continued)

(52) U.S. Cl.

CPC ....... *H10D 86/60* (2025.01); *G02F 1/136222* (2021.01); *G02F 1/1368* (2013.01);

(Continued)

(58) Field of Classification Search

CPC .. H10D 86/60; H10D 86/0221; H10D 86/421; G02F 1/136222; G02F 1/1368; H10K 59/1201; H10K 59/12

See application file for complete search history.

(56) References Cited

U.S. PATENT DOCUMENTS

2004/0080700 A1 4/2004 Kang
2015/0187640 A1 7/2015 Wu (Continued)

FOREIGN PATENT DOCUMENTS

CN 1847940 A 10/2006
CN 104934110 A 9/2015

(Continued)

OTHER PUBLICATIONS

Chinese Office Action issued in corresponding Chinese Patent Application No. 202010781420.3 dated Apr. 23, 2023, pp. 1-11.

(Continued)

*Primary Examiner* — Benjamin Tzu-Hung Liu

(74) *Attorney, Agent, or Firm* — PV IP PC; Peter Stecher; Wei Te Chung

(57) ABSTRACT

An array substrate, a method of manufacturing thereof, and a display panel are provided. A source-drain layers are formed by a laminated metal layer. The laminated metal layer includes a first metal layer, a second metal layer, and a third metal layer that are stacked in order. By etching the stacked metal layer twice, a width of the third metal layer in the formed source-drain layer is less than or equal to a width of the second metal layer, thereby solving the problem of the undercutting of the laminated metal electrode in the array substrate of the prior art.

20 Claims, 9 Drawing Sheets

(51) Int. Cl.

| | |
|---|---|
| ***G02F 1/1368*** | (2006.01) |
| ***H10D 86/01*** | (2026.01) |
| ***H10D 86/40*** | (2025.01) |
| ***H10K 59/12*** | (2023.01) |

(52) U.S. Cl.

CPC ....... *H10D 86/0221* (2025.01); *H10D 86/421* (2025.01); *H10K 59/1201* (2023.02)

(56) References Cited

U.S. PATENT DOCUMENTS

| | | | | |
|---|---|---|---|---|
| 2016/0217743 | A1* | 7/2016 | Kim | H10K 59/131 |
| 2018/0210277 | A1* | 7/2018 | Wang | H10K 59/38 |
| 2021/0405489 | A1* | 12/2021 | Cheng | G02F 1/1345 |
| 2021/0408178 | A1* | 12/2021 | Zhou | H10K 71/60 |
| 2023/0282777 | A1* | 9/2023 | Moon | H10H 20/819 257/79 |

FOREIGN PATENT DOCUMENTS

| | | | |
|---|---|---|---|
| CN | 107731748 | A | 2/2018 |
| CN | 109979882 | A | 7/2019 |
| CN | 110890323 | A | 3/2020 |
| CN | 111129104 | A | 5/2020 |

OTHER PUBLICATIONS

International Search Report in International application No. PCT/CN2020/111188,mailed on Apr. 25, 2021.

Written Opinion of the International Search Authority in International application No. PCT/CN2020/111188,mailed on Apr. 25, 2021.

* cited by examiner

ARRAY SUBSTRATE, METHOD OF MANUFACTURING THEREOF, AND DISPLAY PANEL

RELATED APPLICATIONS

This application is a Notional Phase of PCT Patent Application No. PCT/CN2020/111188 having international filing date of Aug. 26, 2020, which claims the benefit of priority of Chinese Patent Application No. 202010781420.3 filed on Aug. 6, 2020. The contents of the above applications are all incorporated by reference as if fully set forth herein in their entirety.

FIELD OF INVENTION

The present invention relates to the field of display technology, and more particularly, to an array substrate, a method of manufacturing thereof, and a display panel.

DESCRIPTION OF PRIOR ART

During manufacturing display panel array processes, in order to balance the development and design requirements of the panel and the process characteristics, laminated metal electrode structures are often used. For example, in order to avoid voltage drop of driving metal traces, aluminum (AL) with a low resistivity is usually selected as the metal trace. However, aluminum has poor resistance to acid and alkali chemicals in the manufacturing processes. As shown in FIG. 1, a top layer of titanium (Top Ti) 3 and a bottom layer of titanium (Bottom Ti) 1 are usually disposed on the upper and lower layers of the aluminum layer 2 to form a sandwich structure to ensure stability of the metal electrodes in the manufacturing processes. However, in the subsequent manufacturing array processes, there are still many process factors that cause exposed aluminum on the side of the laminated metal to be dissolved and etched. As shown in FIG. 2, since the titanium layer disposed on and under the aluminum layer 2' has relatively stable chemical properties, the top layer of titanium 3 and the bottom layer of titanium 1 are not be side-etched, and only the aluminum layer 2' in the exposed laminated metal electrode is side-etched, thereby forming a shape of the undercut of the “I”. The undercutting of laminated metal electrodes may cause a variety of product defects. For example, peeling of the top layer of titanium above the undercut may cause a short circuit between two adjacent electrodes, which may result in poor display. At the same time, in the subsequent organic photoresist manufacturing processes, due to the presence of the undercut morphology, organic photoresist residues may be generated between two titanium layers of the laminated metal electrode, causing water vapor to get into channels, so as to make packaging failure.

Therefore, the problem of undercutting of the laminated metal electrodes in the array substrate of the prior art needs to be solved.

SUMMARY OF INVENTION

Technical Problem

An array substrate, a method of manufacturing thereof, and a display panel are provided, so as to solve the technical problem of the undercut phenomenon of the laminated metal electrodes in the array substrate of the prior art.

Solution to Technical Problem

Technical Solution

A method of manufacturing an array substrate comprises following steps:

step S10, forming an active layer, comprising providing a substrate and forming the active layer on the substrate; step S20, forming a gate, comprising forming a gate insulating layer on the active layer and a gate on the gate insulating layer; and step S30, forming a source-drain layer, comprising forming an interlayer insulating layer on the gate and the gate insulating layer, patterning the interlayer insulating layer to form a first via hole and a second via hole, and forming a laminated metal layer in the first via hole and the second via hole to be the source-drain layer. The forming the laminated metal layer comprises following steps: step S31, forming a first metal layer, a second metal layer, and a third metal layer in the first via hole and the second via hole and above the interlayer insulating layer; step S32, performing a photolithography process on the first metal layer, the second metal layer, and the third metal layer to form the laminated metal layer, wherein a width of the third metal layer is less than or equal to a width of the second metal layer, and a width of the third metal layer is less than a width of the first metal layer.

In one embodiment, the method further comprises step S40, forming a pixel electrode, comprising forming a planarization layer on the source-drain layer and the interlayer insulating layer and forming the pixel electrode on the planarization layer.

In one embodiment, the first metal layer and the third metal layer are made of titanium, and the second metal layer is made of aluminum.

In one embodiment, in the step S32, the forming the laminated metal layer comprises following steps: step S321, coating a photoresist on the third metal layer, and exposing and developing the photoresist to form a patterned photoresist; step S322, performing a first etching on the first metal layer, the second metal layer, and the third metal layer by the patterned photoresist as a shield; step S323, ashing the patterned photoresist, wherein both sides of ashed photoresist pattern exposes a part of the third metal layer; step S324, performing a second etching on the third metal layer by the ashed patterned photoresist as a shield; and step S325, stripping the ashed patterned photoresist.

In one embodiment, the first etching and the second etching comprise dry etching.

In one embodiment, the patterned photoresist is treated with ashing gas, and the ashing gas comprises oxygen.

In one embodiment, step of stripping the ashed patterned photoresist comprises using a photoresist stripping solution to strip the ashed patterned photoresist.

In one embodiment, the gate is formed by the laminated metal layer.

In one embodiment, the active layer comprises a doped region, and a source and a drain contact with the doped region through the first via hole and the second via hole.

In one embodiment, material of the gate insulating layer comprises at least one of silicon oxide, silicon nitride, and silicon oxynitride.

In one embodiment, material of the interlayer insulating layer comprises at least one of silicon oxide, silicon nitride, and silicon oxynitride.

An array substrate comprises: a substrate; an active layer disposed on the substrate; a gate insulating layer covering the active layer and the substrate; a gate disposed on the gate insulating layer; an interlayer insulating layer covering the gate and the gate insulating layer, and a first vie hole and a second via hole are formed in the interlayer insulating layer; a source-drain layer comprising a source and a drain disposed in the first via hole and the second via hole, wherein the source and the drain contact with the active layer through the first via hole and the second via hole; a planarization layer covering the source-drain layer and the interlayer insulating layer; and a pixel electrode disposed on the planarization layer. The source and the drain comprise a laminated metal layer in the first via hole and the second via hole and on the interlayer insulating layer, the laminated metal layer comprises a first metal layer, a second metal layer, and a third metal layer, a width of the third metal layer is less than or equal to a width of the second metal layer, and the width of the third metal layer is less than a width of the first metal layer.

In one embodiment, the first metal layer and the third metal layer are made of titanium, and the second metal layer is made of aluminum.

In one embodiment, material of the active layer comprises one of amorphous silicon and low-temperature polysilicon.

In one embodiment, a third via hole is formed in the planarization layer, and the pixel electrode contacts with the drain through the third via hole.

In one embodiment, the active layer comprises a doped region, and a source and a drain contact with the doped region through the first via hole and the second via hole.

In one embodiment, the gate comprises the first metal layer, the second metal layer, and the third metal layer that are stacked in order.

A display panel comprises the array substrate comprising the array substrate in the above-mentioned embodiments.

In one embodiment, the display panel comprises a liquid crystal display panel, the liquid crystal display panel comprises a color filter substrate disposed opposite to the array substrate and a plurality of liquid crystal molecules disposed between the array substrate and the color filter substrate.

In one embodiment, the display panel comprises an organic light emitting diode (OLED) display panel, and the OLED display panel comprises a light emitting functional layer disposed on the array substrate and a packaging layer disposed on the light emitting functional layer.

Advantageous Effect

The beneficial effects of the present invention are described as follows: an array substrate, a method of manufacturing thereof, and a display panel are provided. The source-drain layer of the array substrate is formed by the laminated metal layer. The laminated metal layer comprises a first metal layer, a second metal layer, and a third metal layer that are stacked in order. By etching the third metal layer twice, a width of the third metal layer is less than or equal to a width of the second metal layer in the formed laminated metal layer, and the width of the third metal layer is less than a width of the first metal layer, so as to avoid undercutting of the laminated metal after etching. The problem of undercutting after etching the laminated metal layer is avoided. Furthermore, it avoids problems that when the third metal layer is stripped off to cause the two adjacent electrodes are short-circuited and causes poor display. At the same time, in the subsequent organic photoresist manufacturing process, no organic photoresist residue will be generated between the first metal layer and the third metal layer, thereby avoiding packaging failure caused by water vapor intrusion.

BRIEF DESCRIPTION OF DRAWINGS

In order to more clearly illustrate the technical solutions in the embodiments, the drawings described in the description of the embodiments are briefly described below. It is obvious that the drawings in the following description are only some embodiments of the present invention. Other drawings can also be obtained from those skilled persons in the art based on drawings without any creative effort.

DETAILED DESCRIPTION OF PREFERRED EMBODIMENTS

Figure 1:
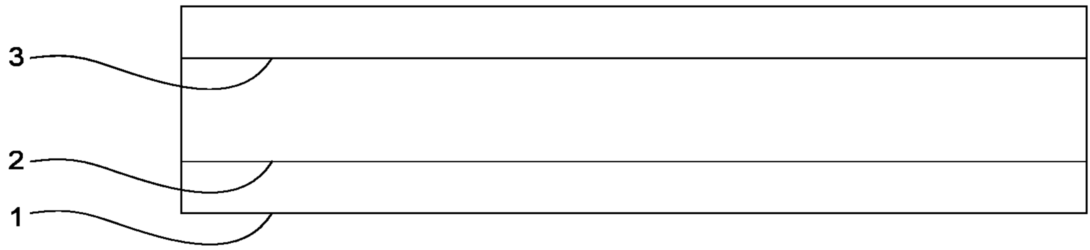
FIG. 1 is a schematic structural view of a laminated metal layer in the prior art.
Figure 2:
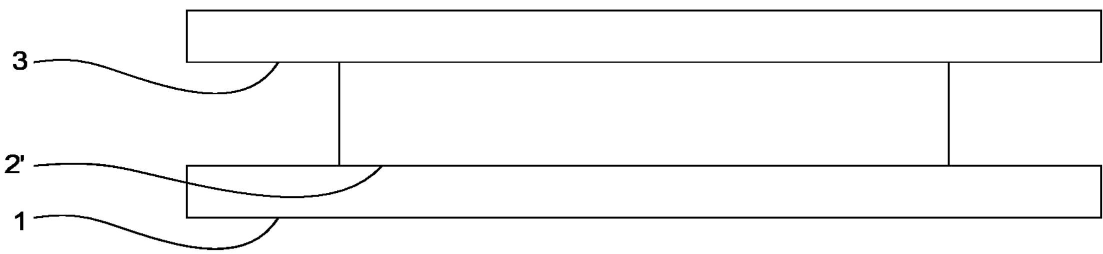
FIG. 2 is a schematic structural view of a undercutting phenomenon in a laminated metal layer in the prior art.

Directional terms mentioned in this application, such as "up," "down," "forward," "backward," "left," "right," "inside," "outside," "side," etc., are merely indicated the direction of the drawings. Therefore, the directional terms are used for illustrating and understanding of the application rather than limiting thereof. In the drawings, units with similar structures are indicated by the same reference numerals. In the drawings, the thickness of some layers and regions are exaggerated for clear understanding and ease of description. That is, the size and thickness of each component shown in the drawings are arbitrarily shown, but the application is not limited thereto.

Figure 3:
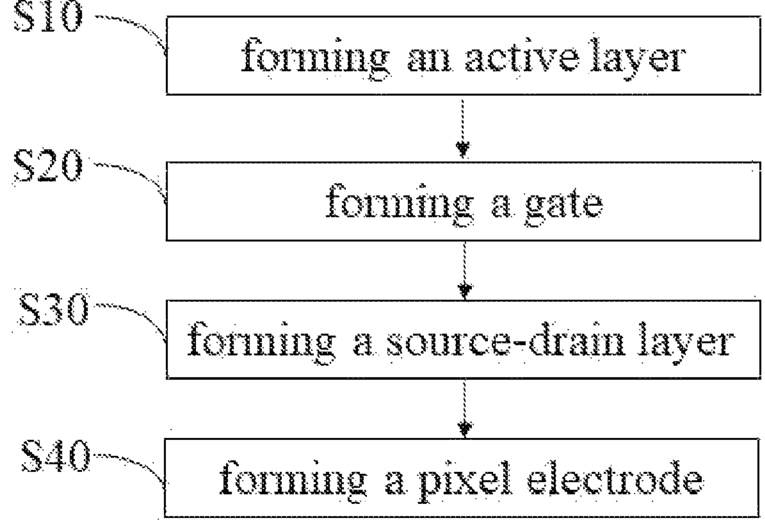
FIG. 3 is a schematic flowchart of a method of manufacturing an array substrate according to one embodiment of the present invention.

In one embodiment, as shown in FIG. 3, a method of manufacturing an array substrate is provided, and the method comprises steps as follows.

Figure 4:
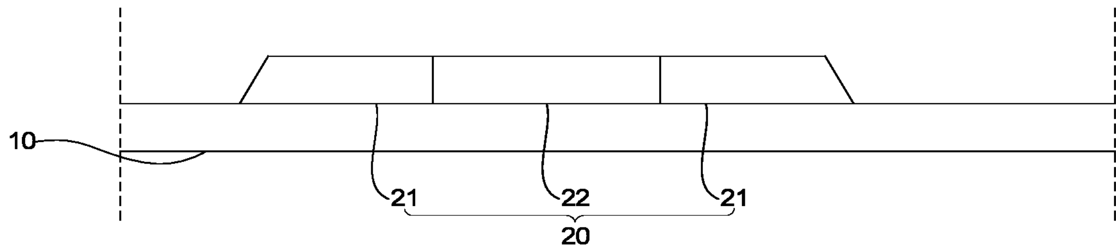
FIG. 4 to FIG. 14 are schematic structural views of layers manufactured in each step of the method for manufacturing the array substrate according to one embodiment of the present invention.

As shown in FIG. 4, step S10, forming an active layer. Step S10 comprises providing a substrate 10 and forming the active layer 20 on the substrate 10.

Specifically, the substrate comprises a glass substrate or a flexible substrate.

Before forming the active layer on the base substrate, a barrier layer and a buffer layer are formed on the substrate to protect each layer subsequently formed on the substrate. This application will not be described herein.

Furthermore, material of the active layer comprises amorphous silicon (a-Si) or low temperature polysilicon (LTPS).

Furthermore, taking amorphous silicon as an example, a whole layer of amorphous silicon is formed on a substrate. Then, performing a photolithography process on the entire amorphous silicon layer to form a patterned active layer, and the amorphous silicon on both sides of the patterned active layer is ion-doped to form doped regions 21, and a channel region 22 is located between doped regions on both sides of the patterned active layer. As shown in FIG. 4, The active layer 20 comprises a doped region 21 and a channel region 22.

Step S20, forming a gate, and the step S20 comprises forming a gate insulating layer on the active layer and a gate on the gate insulating layer.

Figure 5:
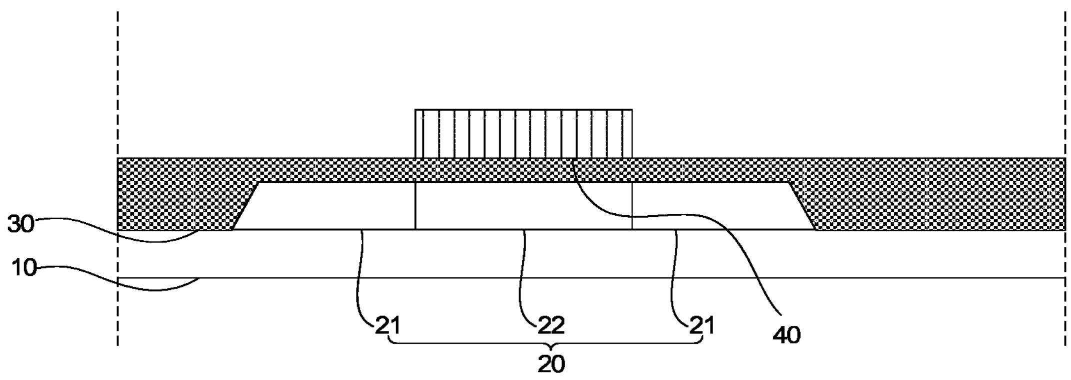

Specifically, as shown in FIG. 5, a gate insulating layer 30 is formed on the active layer 20 and the substrate 10. A material of the gate insulating layer 30 comprises inorganic materials such as silicon oxide, silicon nitride, and silicon oxynitride.

Furthermore, a metal layer is formed on the gate insulating layer 30, and a photolithography process is performed on the metal layer to form the gate 40. Specifically, a material of the metal layer comprises copper and molybdenum or alloys thereof.

Figure 15:
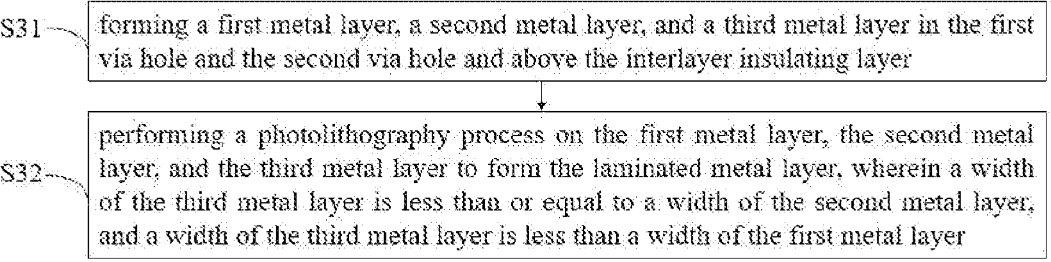
FIG. 15 is a schematic flowchart of a method of manufacturing a laminated metal layer according to one embodiment of the present invention.

Referring to FIG. 3 and FIG. 15, step S30, forming a source-drain layer, and the step S30 comprises forming an interlayer insulating layer on the gate and the gate insulating layer, patterning the interlayer insulating layer to form a first via hole and a second via hole, and forming a laminated metal layer in the first via hole and the second via hole to be the source-drain layer. The forming the laminated metal layer comprises following steps: step S31, forming a first metal layer, a second metal layer, and a third metal layer in the first via hole and the second via hole and above the interlayer insulating layer; and step S32, performing a photolithography process on the first metal layer, the second metal layer, and the third metal layer to form the laminated metal layer, and a width of the third metal layer is less than or equal to a width of the second metal layer, and a width of the third metal layer is less than a width of the first metal layer.

Figure 6:
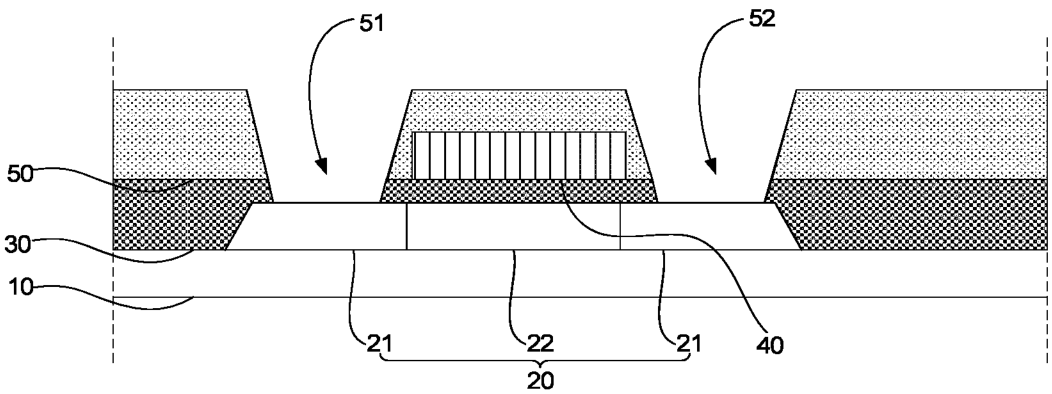

Specifically, as shown in FIG. 6, an interlayer insulating layer 50 is formed on the gate 40 and the gate insulating layer 30. A material of the interlayer insulating layer 50 comprises inorganic materials such as silicon oxide, silicon nitride, and silicon oxynitride.

Furthermore, a first via hole 51 and a second via 52 are formed in the interlayer insulating layer 50 by a photolithography process. The first via hole 51 and the second via hole 52 penetrate the interlayer insulating layer 50 and a part of the gate insulating layer 30 to expose the doped region 21 of the active layer 20.

Furthermore, a laminated metal layer is formed on the interlayer insulating layer 50 and in the first via hole 51 and the second via hole 52 to be a source-drain layer.

Figure 7:
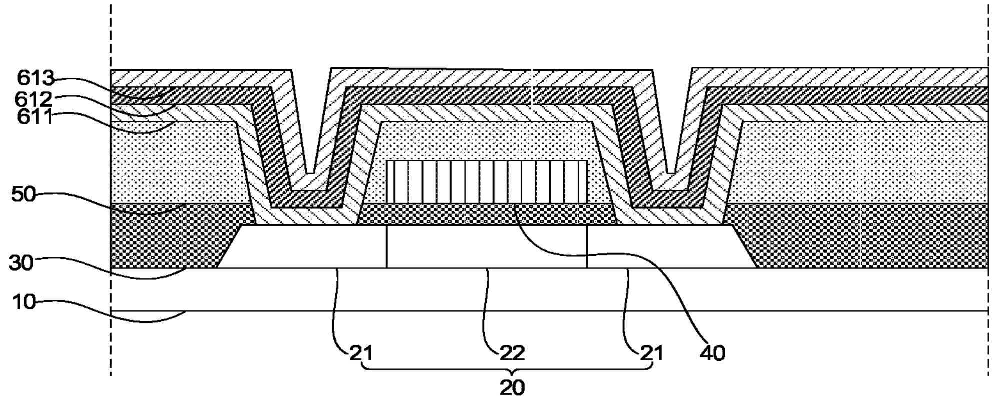

Specifically, referring to FIG. 6 and FIG. 7, steps of forming a laminated metal layer comprise sequentially stacking and depositing a first metal layer 611, a second metal layer 612, and a third metal layer 613 in the first via hole and the second via hole and above the interlayer insulating layer. The first metal layer 611 and the third metal layer 613 are made of titanium, and the second metal layer 612 is made of aluminum.

Furthermore, the first metal layer 611, the second metal layer 612, and the third metal layer 613 are performed with a photography process to form the laminated metal layer.

Figure 8:
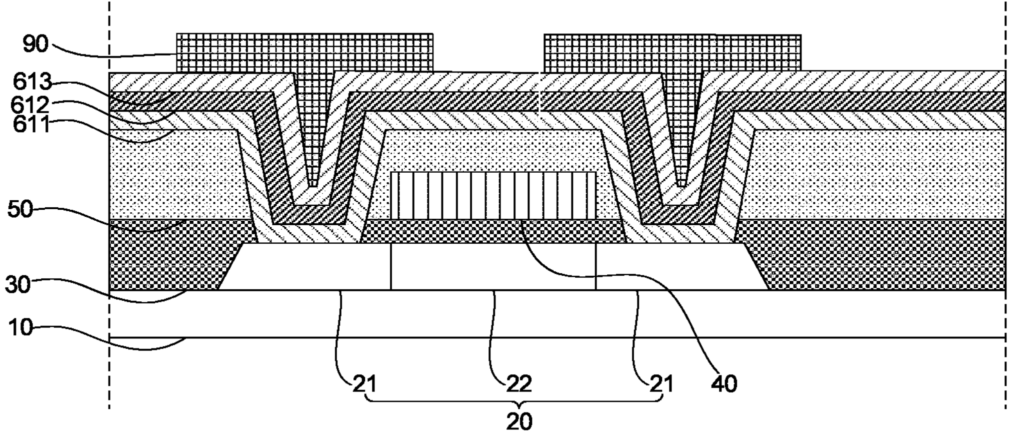
Figure 16:
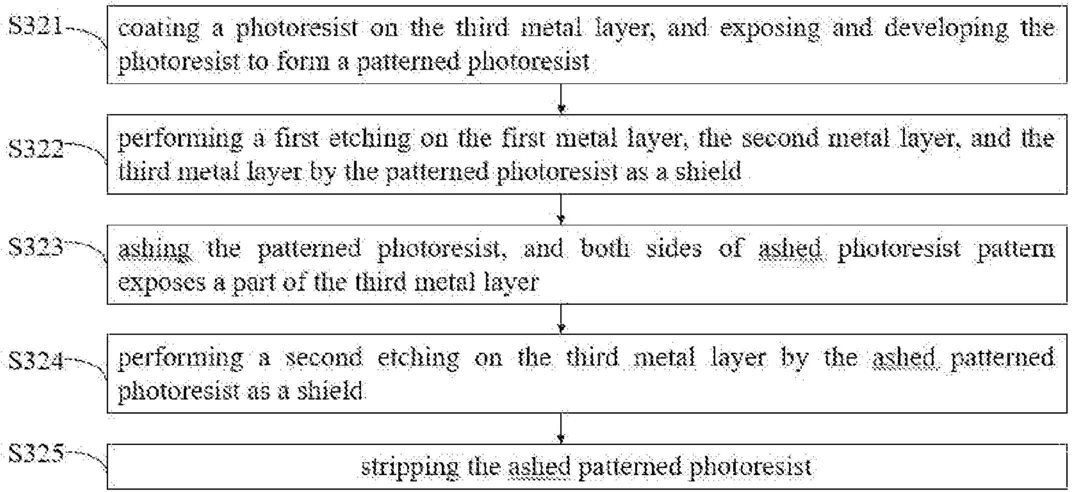
FIG. 16 is a schematic view of a photography process for manufacturing a laminated metal layer according to one embodiment of the present invention.

Specifically, referring to FIG. 8 and FIG. 16, as shown in FIG. 16, the photography process for forming the laminated metal layer comprises steps of: step S321, coating a photoresist on the third metal layer 613, and exposing and developing the photoresist to form a patterned photoresist 90, as shown in FIG. 8. Specifically, the photoresist comprises positive photoresist or negative photoresist.

Figure 9:
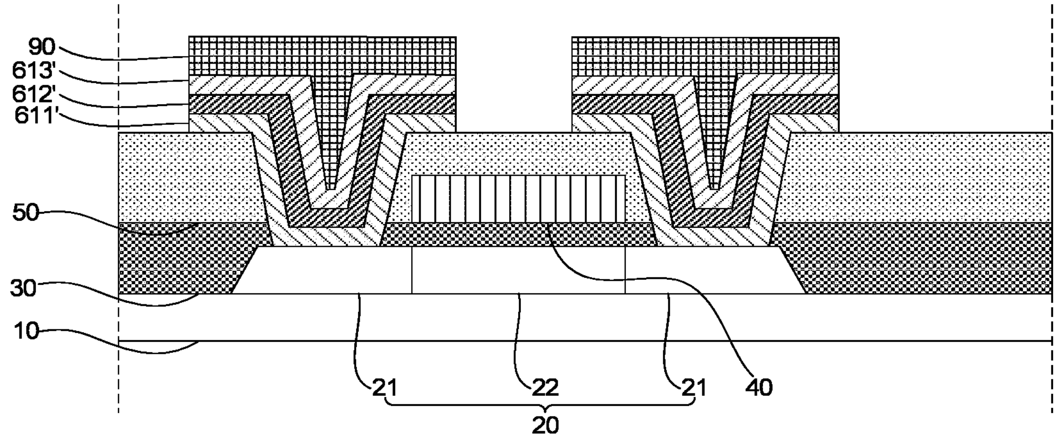

Furthermore, step S322, performing a first etching on the first metal layer 611, the second metal layer 612, and the third metal layer 613 by the patterned photoresist 90 as a shield. Specifically, dry etching can be used for the first etching. The first metal layer 611, the second metal layer 612, and the third metal layer 613 not blocked by the patterned photoresist 90 are etched, and the first metal layer 611', the second metal layer 612' and the third metal layer 613' are formed after the first etching, as shown in FIG. 9.

Figure 10:
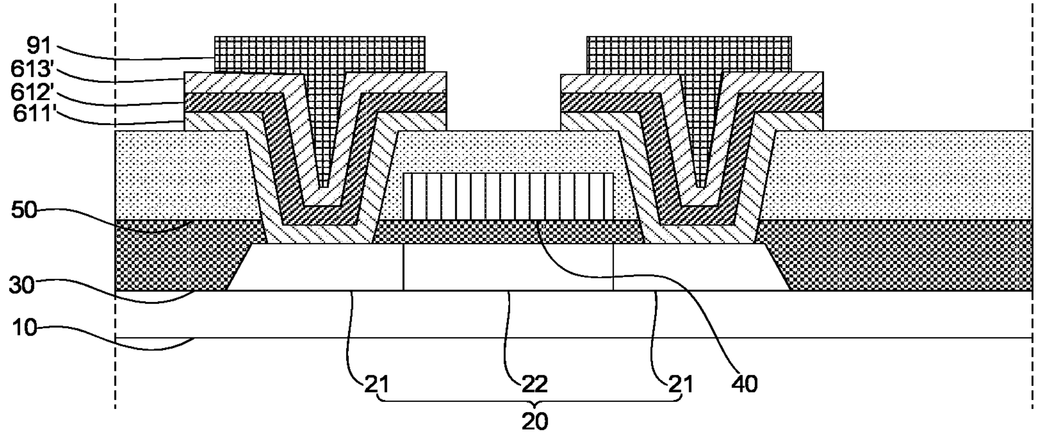

Furthermore, step S323, ashing the patterned photoresist 90, and both sides of ashed patterned photoresist 91 exposes a part of the third metal layer 613', as shown in FIG. 10.

Oxygen or other ashing gas is used to ash the patterned photoresist 90. A width of both sides of ashed patterned photoresist can be determined by a width of the second metal layer 612' that is side etched in the subsequent manufacturing process. That is, the width of the second metal layer 612' that is side etched in the subsequent manufacturing process is less than or equal to the width of both sides of ashed patterned photoresist 90.

Figure 11:
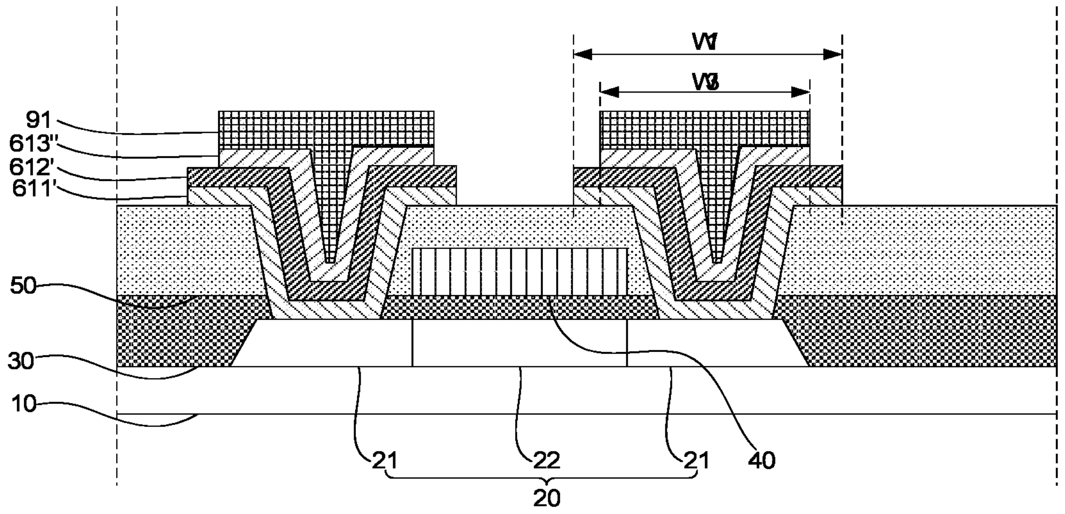

Furthermore, step S324, performing a second etching on the third metal layer 613' by the ashed patterned photoresist 91 as a shield, so as to expose a part of the second metal layer 612', and thus the first metal layer 611', the second metal layer 612', and the third metal layer 613" after the second etching are formed, as shown in FIG. 11.

Specifically, referring to FIG. 10 and FIG. 11, dry etching may be used to perform a second etching on the exposed third metal layer 613', so that all parts of the third metal layer 613' exposed outside the ashed patterned photoresist 91 are etched, and a part of the second metal layer 612' is exposed. Of course, when the exposed third metal layer 613' is etched, a part of the second metal layer 612' may be etched.

Furthermore, a width W3 of the third metal layer 613" after the second etching is less than a width W1 of the first metal layer 611'.

Figure 12:
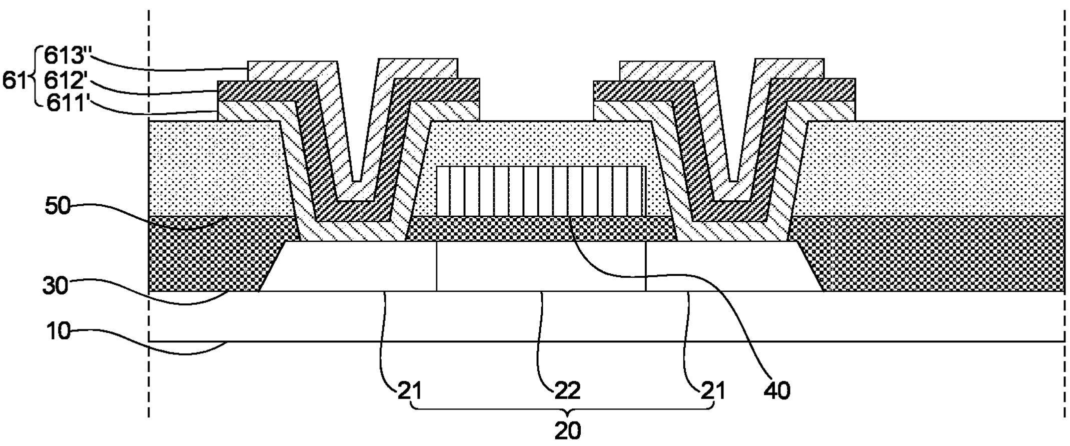

Furthermore, step S325, stripping the ashed patterned photoresist 91 by using a photoresist stripping solution to form a layer structure as shown in FIG. 12.

Figure 13:
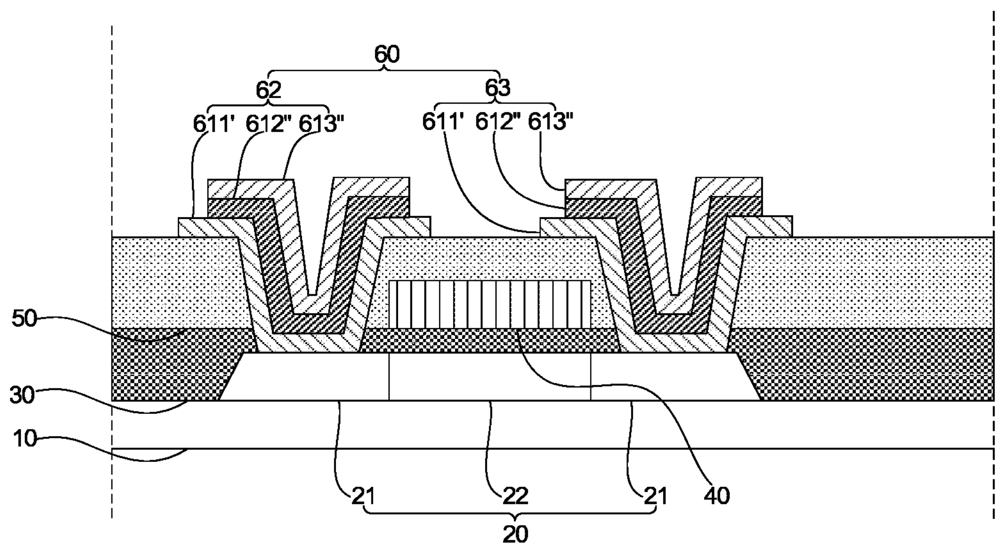

It should be noted that the laminated metal layer 61 shown in FIG. 12 is not the final type of the source-drain layer. Further, the width W3 of the third metal layer 613" after the second etching is smaller than the width W1 of the first metal layer 611'. Because in the subsequent array manufacturing process, the exposed second metal layer 612' will be etched by other process factors, such as alkaline developer or acid etching solution. The exposed second metal layer 612' is etched, which is shown in FIG. 13. The laminated metal layer shown in FIG. 13 is the final type of the source-drain layer 60. The source-drain layer 60 comprises a source 62 and a drain 63. The source 62 and the drain 63 penetrate the first via hole and the second via hole to contact with the doped region 21 of the active layer 20. In FIG. 13, two sides of the third metal layer 613" are aligned with two sides of the second metal layer 612". That is, the width of the third metal layer 613" is equal to the width of the second metal layer 612". Of course, the width of the third metal layer 613" may also be less than the width of the second metal layer 612" due to varying degrees of influence of process factors.

Referring to FIG. 3, the method of manufacturing the array substrate further comprises step S40 of forming a pixel electrode. The step S40 comprises forming a planarization layer on the source-drain layer and the interlayer insulating layer and forming the pixel electrode on the planarization layer.

Figure 14:
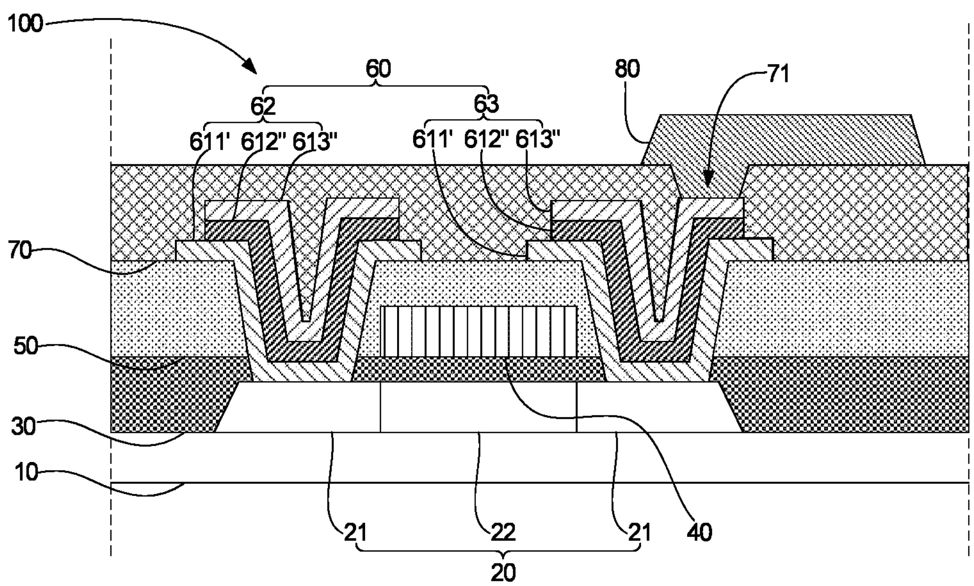

Specifically, as shown in FIG. 14, a planarization layer 70 is formed on the source-drain layer 60 and interlayer insulating layer 50. A third via hole 71 is formed on the planarization layer 70 by a photolithography process. The third via hole 71 penetrates the planarization layer 70 to the drain 63 of the source-drain layer 60.

Furthermore, a pixel electrode 80 is formed on the planarization layer 70, and the pixel electrode 80 is connected to the drain 63 of the source-drain layer 60 through the third via hole 71, so as to form the array substrate 100 as shown in FIG. 14.

In another embodiment, the difference from the above-mentioned embodiment is that the gate can also be formed by using the laminated metal layer. In addition, the same process as that used to form the source and drain is used to make the shape of the laminated metal layer of the gate and the shape of the laminated metal layer of the source and drain the same. That is to avoid undercutting of the laminated metal layer. For the specific forming steps, please refer to the steps of forming the source-drain layer. For other descriptions, please refer to the above-mentioned embodiments, which will not be repeated herein.

In one embodiment, an array substrate 100 is provided as shown in FIG. 14. The array substrate 100 comprises a substrate 10, an active layer 20, a gate insulating layer 30, a gate 40, an interlayer insulating layer 50, a source-drain layer 60, a source-drain layer 70, and a pixel electrode 80. The active layer 20 is disposed on the substrate 10. The gate insulating layer 30 covers the active layer 20 and the substrate 10. The gate 40 is disposed on the gate insulating layer 30. The interlayer insulating layer 50 covers the gate 40 and the gate insulating layer 30. A first vie hole and a second via hole are formed in the interlayer insulating layer 30. The source-drain layer comprises a source 62 and a drain 63 disposed in the first via hole and the second via hole. The source 62 and the drain 63 contact with the active layer 20 through the first via hole and the second via hole. The planarization layer 70 covers the source-drain layer 60 and the interlayer insulating layer 50. The pixel electrode 80 is disposed on the planarization layer 70. The source 62 and the drain 63 comprise a laminated metal layer in the first via hole and the second via hole and on the interlayer insulating layer 50. The laminated metal layer comprises a first metal layer 611', a second metal layer 612'', and a third metal layer 613'''. A width of the third metal layer 613''' is less than or equal to a width of the second metal layer 612''. A width of the third metal layer 613''' is equal to a width of the second metal layer 612'', as shown in FIG. 14. The width of the third metal layer 613''' is less than a width of the first metal layer 611'.

Specifically, the first metal layer and the third metal layer are made of titanium, and the second metal layer is made of aluminum.

Specifically, the active layer 20 comprises a channel region 22 and a doped region 21. The source 62 and the drain 63 contact with the doped region 21 through the first via hole and the second via hole. A material of the active layer 20 comprises one of amorphous silicon and low-temperature polysilicon.

Furthermore, a third via hole 71 is formed in the planarization layer 70, and the pixel electrode 80 contacts with the drain 63 through the third via hole 71.

It should be noted that the gate may also use the same laminated metal layer as the source or drain, that is, the gate comprises the first metal layer, the second metal layer, and the third metal layer. The width of the third metal layer is less than or equal to the width of the second metal layer to avoid undercutting of the laminated metal.

In an embodiment, a display panel is provided, and the display panel comprises the array substrate of the foregoing embodiment.

Figure 17:
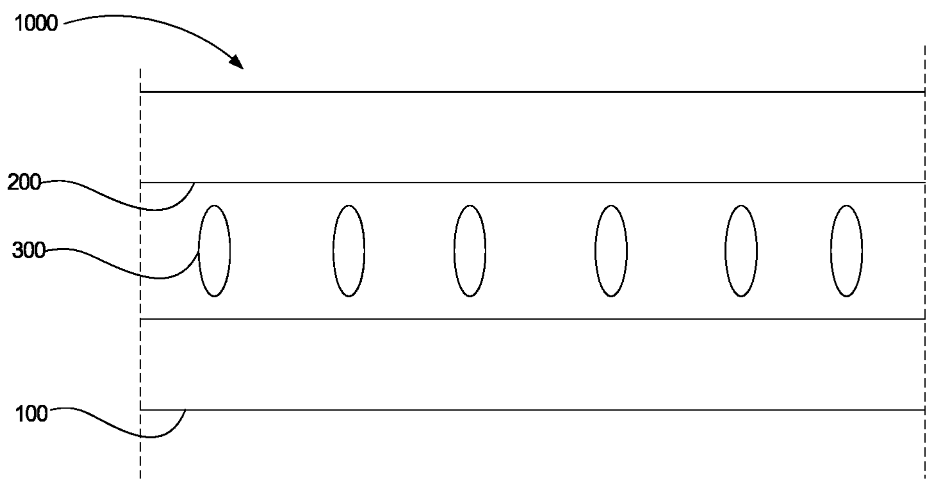
FIG. 17 is a schematic view of the first structure of a display panel according to one embodiment of the present invention.

Specifically, the display panel may be a liquid crystal display panel. As shown in FIG. 17, the liquid crystal display panel 1000 comprises an array substrate 100, a color filter substrate 200 disposed opposite to the array substrate 100, and a plurality of liquid crystal molecules 300 disposed between the array substrate 100 and the color filter substrate 200.

Figure 18:
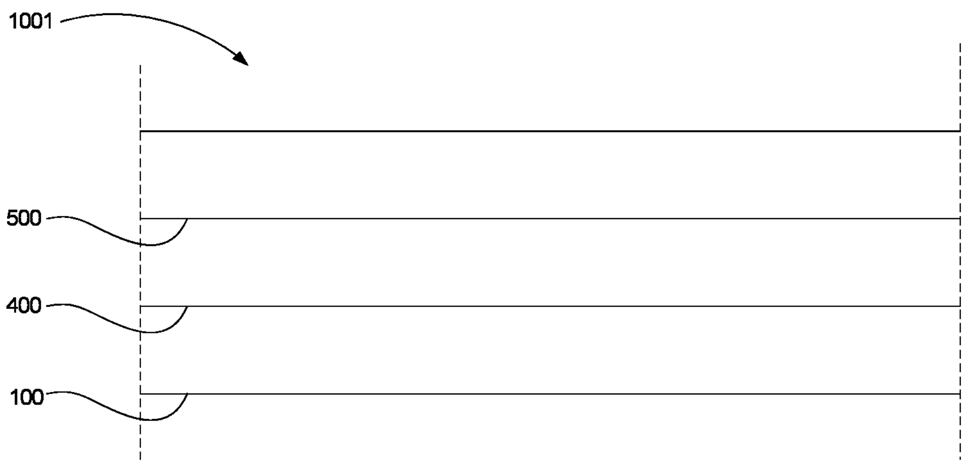
FIG. 18 is a schematic view of a second structure of a display panel according to one embodiment of the present invention.

Specifically, the display panel may be an organic light emitting diode (OLED) display panel. As shown in FIG. 18, the OLED display panel 1001 comprises an array substrate 100, a light emitting functional layer 400 disposed on the array substrate 100, and a packaging layer 500 disposed on the light emitting functional layer 400.

According to the above embodiment, it can be seen that: an array substrate, a method of manufacturing thereof, and a display panel are provided. The source-drain layer of the array substrate is formed by the laminated metal layer. The laminated metal layer comprises a first metal layer, a second metal layer, and a third metal layer that are stacked in order. By etching the third metal layer twice, a width of the third metal layer is less than or equal to a width of the second metal layer in the formed laminated metal layer, and the width of the third metal layer is less than a width of the first metal layer, so as to avoid undercutting of the laminated metal after etching. The problem of undercutting after etching the laminated metal layer is avoided. Furthermore, it avoids problems that when the third metal layer is stripped off to cause the two adjacent electrodes are short-circuited and causes poor display. At the same time, in the subsequent organic photoresist manufacturing process, no organic photoresist residue will be generated between the first metal layer and the third metal layer, thereby avoiding packaging failure caused by water vapor intrusion.

In the above, the present application has been described in the above preferred embodiments, but the preferred embodiments are not intended to limit the scope of the invention, and a person skilled in the art may make various modifications without departing from the spirit and scope of the application. The scope of the present application is determined by claims.

What is claimed is:

1. A method of manufacturing an array substrate, comprising following steps:

step S10, forming an active layer, comprising providing a substrate and forming the active layer on the substrate;

step S20, forming a gate, comprising forming a gate insulating layer on the active layer and a gate on the gate insulating layer; and step S30, forming a source-drain layer, comprising forming an interlayer insulating layer on the gate and the gate insulating layer, patterning the interlayer insulating layer to form a first via hole and a second via hole, and forming a laminated metal layer in the first via hole and the second via hole to be the source-drain layer;

wherein the forming the laminated metal layer comprises following steps:

step S31, forming a first metal layer, a second metal layer, and a third metal layer in the first via hole and the second via hole and above the interlayer insulating layer; and step S32, performing a photolithography process on the first metal layer, the second metal layer, and the third metal layer to form the laminated metal layer, wherein a width of the third metal layer is less than or equal to a width of the second metal layer, and a width of the third metal layer is less than a width of the first metal layer;

wherein the first metal layer and the third metal layer are made of titanium, and the second metal layer is made of aluminum; and wherein in the step S32, the forming the laminated metal layer comprises following steps:

step S321, coating a photoresist on the third metal layer, and exposing and developing the photoresist to form a patterned photoresist;

step S322, performing a first etching on the first metal layer, the second metal layer, and the third metal layer by the patterned photoresist as a shield;

step S323, ashing the patterned photoresist, wherein both sides of ashed photoresist pattern exposes a part of the third metal layer;

step S324, performing a second etching on the third metal layer by the ashed patterned photoresist as a shield; and step S325, stripping the ashed patterned photoresist.

2. The method of manufacturing the array substrate according to claim 1, further comprising step S40, forming a pixel electrode, comprising forming a planarization layer on the source-drain layer and the interlayer insulating layer and forming the pixel electrode on the planarization layer.

3. The method of manufacturing the array substrate according to claim 1, wherein the first etching and the second etching comprise dry etching.

4. The method of manufacturing the array substrate according to claim 1, wherein the patterned photoresist is treated with ashing gas, and the ashing gas comprises oxygen.

5. The method of manufacturing the array substrate according to claim 1, wherein step of stripping the ashed patterned photoresist comprises using a photoresist stripping solution to strip the ashed patterned photoresist.

6. The method of manufacturing the array substrate according to claim 1, wherein the gate is formed by the laminated metal layer.

7. The method of manufacturing the array substrate according to claim 1, wherein the active layer comprises a doped region, and a source and a drain contact with the doped region through the first via hole and the second via hole.

8. The method of manufacturing the array substrate according to claim 1, wherein material of the gate insulating layer comprises at least one of silicon oxide, silicon nitride, and silicon oxynitride.

9. The method of manufacturing the array substrate according to claim 1, wherein material of the interlayer insulating layer comprises at least one of silicon oxide, silicon nitride, and silicon oxynitride.

10. An array substrate, comprising:

a substrate;

an active layer disposed on the substrate;

a gate insulating layer covering the active layer and the substrate;

a gate disposed on the gate insulating layer;

an interlayer insulating layer covering the gate and the gate insulating layer, wherein a first vie hole and a second via hole are formed in the interlayer insulating layer;

a source-drain layer comprising a source and a drain disposed in the first via hole and the second via hole, wherein the source and the drain contact with the active layer through the first via hole and the second via hole;

a planarization layer covering the source-drain layer and the interlayer insulating layer; and a pixel electrode disposed on the planarization layer;

wherein the source and the drain comprise a laminated metal layer in the first via hole and the second via hole and on the interlayer insulating layer, the laminated metal layer comprises a first metal layer, a second metal layer, and a third metal layer, a width of the third metal layer is less than or equal to a width of the second metal layer, and the width of the third metal layer is less than a width of the first metal layer;

wherein both sides of the second metal layer expose a part of a surface of the first metal layer on a side away from the substrate.

11. The array substrate according to claim 10, wherein the first metal layer and the third metal layer are made of titanium, and the second metal layer is made of aluminum.

12. The array substrate according to claim 10, wherein material of the active layer comprises one of amorphous silicon and low-temperature polysilicon.

13. The array substrate according to claim 10, wherein a third via hole is formed in the planarization layer, and the pixel electrode contacts with the drain through the third via hole.

14. The array substrate according to claim 10, wherein the active layer comprises a doped region, and a source and a drain contact with the doped region through the first via hole and the second via hole.

15. The array substrate according to claim 10, wherein the gate comprises the first metal layer, the second metal layer, and the third metal layer that are stacked in order.

16. A display panel comprising the array substrate of claim 10.

17. The display panel according to claim 16, wherein the display panel comprises a liquid crystal display panel, the liquid crystal display panel comprises a color filter substrate disposed opposite to the array substrate and a plurality of liquid crystal molecules disposed between the array substrate and the color filter substrate.

18. The display panel according to claim 16, wherein the display panel comprises an organic light emitting diode (OLED) display panel, and the OLED display panel comprises a light emitting functional layer disposed on the array substrate and a packaging layer disposed on the light emitting functional layer.

19. The array substrate according to claim 10, wherein an orthographic projection of a side surface of the second metal layer on the substrate is spaced apart from an orthographic projection of the first metal layer on the substrate.

20. The array substrate according to claim 10, wherein both the width of the third metal layer and the width of the second metal layer are less than the width of the first metal layer.

* * * * *